(12) United States Patent
Truong et al.

(10) Patent No.: US 10,641,839 B2
(45) Date of Patent: May 5, 2020

(54) DETECTING KEY POSITIONS TO DETERMINE A TYPE OF CABLE

(71) Applicant: HEWLETT-PACKARD DEVELOPMENT COMPANY, L.P., Spring, TX (US)

(72) Inventors: Binh T. Truong, Spring, TX (US); Nam Nguyen, Spring, TX (US); Robert S Wright, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 212 days.

(21) Appl. No.: 15/709,140

(22) Filed: Sep. 19, 2017

(65) Prior Publication Data

US 2018/0252757 A1    Sep. 6, 2018

Related U.S. Application Data

(63) Continuation of application No. 14/414,755, filed as application No. PCT/US2012/056438 on Sep. 20, 2012, now Pat. No. 9,778,308.

(51) Int. Cl.
*G01R 31/60* (2020.01)
*G06F 13/40* (2006.01)
*G01R 31/58* (2020.01)

(52) U.S. Cl.
CPC ........... *G01R 31/60* (2020.01); *G06F 13/409* (2013.01); *G01R 31/58* (2020.01); *G06F 2213/0042* (2013.01); *Y02D 10/14* (2018.01); *Y02D 10/151* (2018.01)

(58) Field of Classification Search
CPC ... G01R 31/023; G01R 31/021; G06F 13/409; G06F 2213/0042; Y02D 10/151; Y02D 10/14

USPC ................................................... 324/66, 533
See application file for complete search history.

(56) References Cited

U.S. PATENT DOCUMENTS

| | | | |
|---|---|---|---|
| 6,086,430 | A | 7/2000 | Amoni et al. |
| 7,240,229 | B2 | 7/2007 | Frank |
| 7,871,278 | B1 | 1/2011 | Herring et al. |
| 2004/0116005 | A1 | 6/2004 | Choi |
| 2004/0232919 | A1* | 11/2004 | Lacey ............. G01R 31/11 324/533 |

(Continued)

FOREIGN PATENT DOCUMENTS

| CN | 1274437 | 11/2000 |
|---|---|---|
| CN | 1354958 | 6/2002 |

(Continued)

OTHER PUBLICATIONS

International Search Report and Written Opinion, International Application No. PCT/US2012/056438, dated Apr. 22, 2013, pp. 1-8.

*Primary Examiner* — Farhana A Hoque
(74) *Attorney, Agent, or Firm* — Brooks Cameron & Huebsch PLLC

(57) ABSTRACT

Examples disclose a computing system comprising a host device with a connection socket to support multiple types of cables by detecting a first key position and a second key position for determination of the type of cable. Further, the computing system comprises a switching circuit to determine a logic state of each of the key positions. Additionally, the switching circuit is to deliver power associated with the type of cable based on the logic states of the key positions.

15 Claims, 5 Drawing Sheets

(56) References Cited

U.S. PATENT DOCUMENTS

| | | | |
|---|---|---|---|
| 2006/0061369 A1* | 3/2006 | Marks | G06F 11/221 |
| | | | 324/542 |
| 2007/0058332 A1 | 3/2007 | Canterbury et al. | |
| 2007/0124606 A1 | 5/2007 | Hsieh | |
| 2007/0136613 A1 | 6/2007 | Chen | |
| 2007/0150758 A1 | 6/2007 | Henderson et al. | |
| 2008/0168374 A1 | 7/2008 | Blinick et al. | |
| 2009/0228614 A1 | 9/2009 | Hwang | |

FOREIGN PATENT DOCUMENTS

| | | |
|---|---|---|
| CN | 1509109 | 6/2004 |
| CN | 1764912 | 4/2006 |
| CN | 1963547 | 5/2007 |
| CN | 101192938 | 6/2008 |
| CN | 201551735 U | 8/2010 |
| CN | 101933316 | 12/2010 |
| CN | 102341971 | 2/2012 |
| TW | M388164 | 9/2010 |
| TW | M398292 | 2/2011 |
| TW | 201108554 | 3/2011 |
| WO | WO-2012030348 | 3/2012 |

\* cited by examiner

DETECTING KEY POSITIONS TO DETERMINE A TYPE OF CABLE

BACKGROUND

Universal serial bus (USB) is a standard for cables and connectors used in a bus for connection, communication, and power between host devices and peripheral devices. A powered USB cable allows for these peripheral devices to obtain power through their USB host device instead of requiring an independent power supply.

BRIEF DESCRIPTION OF THE DRAWINGS

In the accompanying drawings, like numerals refer to like components or blocks. The following detailed description references the drawings, wherein.

DETAILED DESCRIPTION

Figure 1:
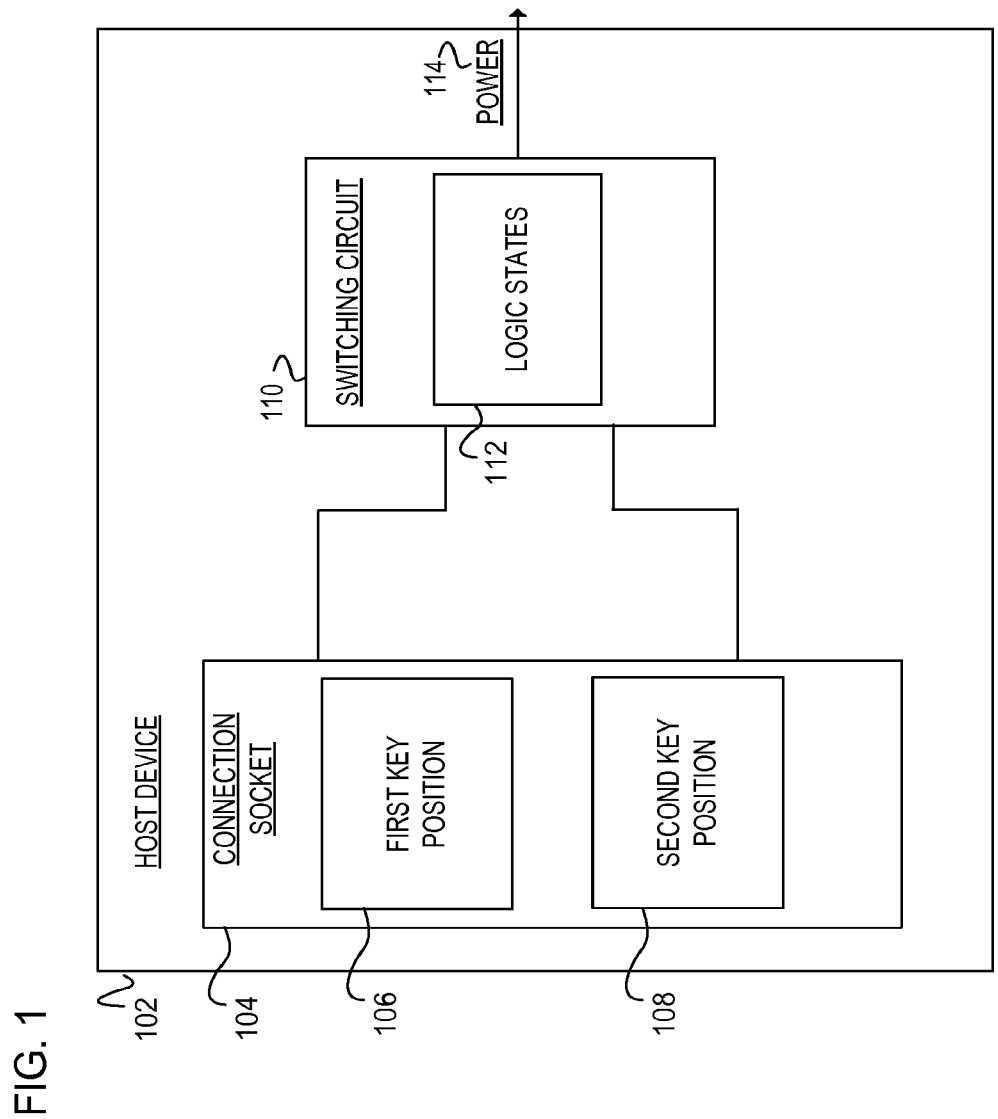
FIG. 1 is a block diagram of an example host device including a connection socket with a first and a second key position to determine a type of cable and a switching circuit to determine a logic state of each of the key positions and to deliver power based on the logic states.

Power may be provided from a host device through a powered USB cable to one or more peripheral devices. However, these powered USB cables are limited by the individual connector power limits prescribed by regulations. As such, each powered USB socket connection provides a key position location corresponding to each level of voltage to deliver to the one or more peripheral devices. The different levels of voltage correspond to the various types of powered USB cables.

One solution is to provide a mechanical barrier to physically block at least a portion of the connector. In this solution a movable barrier is positioned by a user to create the different types of socket structures to deliver the corresponding voltage level. However, this solution requires the barrier to be accessible and controlled by the user to create the socket structure to deliver the corresponding voltage. Further, this solution lacks automation for the host device to detect the type of socket structure to deliver the corresponding voltage. For example, the user moves the mechanical barrier to create a 12 volt powered USB socket connection and to another location to create a 24 volt powered USB socket connection. Additionally, this solution requires much space and design on the host device to incorporate the mechanical barrier.

In another solution, power and communications are delivered on separate USB cables. In this solution, the USB socket delivers communications on a separate socket connection than the power socket. Further, this solution lacks a universal USB connection socket to deliver power and communications through the USB cable. Additionally, this solution requires the use of a separate USB cables to receive both USB data communications and power. Further, this solution also takes up much space on the host device as two different socket connections are required for the data communications and the power delivery.

To address these issues, example embodiments disclosed herein provide a computing system comprising a host device with a connection socket to support multiple types of cables through detecting key positions. This embodiment enables the connection socket to accept and support multiple types of cables providing an aspect of universality to the connection socket. Detecting the key positions enables the host device to determine the type of cable. For example, the key position in the connection socket for a 12 volt powered USB cable is in a different location from the key position for a 24 volt powered USB cable. Rather than requiring different connection sockets, the connection socket supports multiple voltage versions by detecting the key positions to determine that type of version's voltage. Utilizing two key positions enables the host device to identify a type of cable from two or more types of the cables.

Additionally, the host device determines the impedance of each key position. The impedance is a measurement of opposition between each of the key positions in the connection socket on the host device to that of the USB cable. Determining the impedance of each key position provides an auto-detection of the key positions, by measuring the connection between the USB cable and the host device. Further this provides also provides an efficient aspect as it requires no user input.

In another embodiment, the system comprises a switching circuit to determine a logic state of each of the key positions to deliver a power associated with the type of cable based on the logic states. Utilizing the logic states, the switching circuit may switch between various power levels providing additional efficiency.

In a further embodiment, the switching circuit turns off the power (i.e., delivers 0 volts) if it is determined both key positions are activated in the connection socket. Delivering 0 volts provides a safety aspect to prevent voltage and/or power delivery to the peripheral device on the type of cable which may have mechanical failure as inserted into the connection socket. Preventing power delivery prevents additional damage to the USB cable and/or peripheral device when the cable and/or connection socket may suffer a mechanical failure.

Yet, in a further embodiment, the switching circuit includes multiple semiconductors to obtain the logic states of each of the key positions. Utilizing semiconductors enables the host device to utilize internal circuitry to assign logic states to the key positions without the use of an external device which may increase cost, design, and space.

In summary, example embodiments disclosed herein provide a universal powered USB connection socket to detect the type of USB cable and to deliver the corresponding voltage. Further, example embodiments save time and space by providing a universal connection for multiple types of USB cables. In addition, examples provide a connection socket to detect the type of cable for cables other than USB cables.

Referring now to the drawings, FIG. 1 is a block diagram of an example host device 102 including a connection socket 104 with a first key position 106 and a second key position 108, the key positions 106 and 108 determine a type of cable. Additionally, the host device 102 includes a switching circuit 110 to determine a logic state 112 for each of the key positions 106 and 108 to deliver power 114 associated with the type of cable based on the logic states 112. The host device 102 is an electronic device that is programmed to carry out tasks and/or operations. Specifically, the host device 102 is considered an electronic device including a powered universal serial bus connection interface to deliver communication data and/or power 114 over a universal serial bus cable to one or more peripheral devices. In this embodiment, the universal serial bus connection allows for a higher powered device (i.e., peripheral device) to obtain its power through the host device 102 rather than requiring an independent power supply and/or adapter. As such, embodiments of the host device 102 include a computing device, client device, personal computer, desktop computer, laptop, a mobile device, a tablet, a video game console, or other electronic device suitable capable of including a connection socket 104 to detect key positions 106 and 108 to determine the type of corresponding cable. In another embodiment, the host device 102 is a point of sale device supplying power 114 in addition to the data communication to peripheral devices, such as receipt printer, barcode readers, printers, scanners, etc.

The connection socket 104 is a type of port on the host device 102 of which supports multiple types of cables by detecting the key positions 106 and 108. Further, the connection socket 104 communicates with the switching circuit to output the power 114 based on the logic states 112 to one or more peripheral devices. The connection socket 104 is designed to standardize the connection between a USB cable and the host device 102 for communication and/or power 114. The connection socket 104 is a type of electro-mechanical device that joins a cable with the host device 102 to enable data communication and power. In this embodiment, the connection socket 104 operates as an interface between a universal serial bus cable and the host device 102. This allows for the attachment of mice, printers, keyboards, scanners, or other computing accessories. In another embodiment, the connection socket 104 connects the host device 102 to one or more peripheral devices. Embodiments of the connections socket 104 include a port, connection, socket, connector, or other type of electro-mechanical connection capable to detecting key positions 106 and 108 to identify the type of cable.

The key positions 106 and 108 within the socket connection 104 correspond to features that identify the type of cable. Specifically, on an end of the cable, there is a plug and/or connector which contains one or more features to correspond to the key positions 106 and 108. In this embodiment, the key positions 106 and 108 are mechanical attributes that respond to the features in the cable in various locations that form a pattern indicating the type of cable. For example, these mechanical attributes correspond to features within the type of cable being plugged into the connection socket 104 and may include pins, spring triggers, etc. to enable the socket connection 104 identify that type of cable. In this regard, detecting the key positions 106 and 108 provides the connection socket 104 to detect the type of cable other than USB cables. In one embodiment, the key positions 106 and 108 correspond to features on the type of cable to indicate which level of voltage to deliver. In a further embodiment, the key positions 106 and 108 may include a third and fourth key position, each key position located in a separate location and each indicating the type of USB cable. This embodiment may be explained in further detail in FIG. 3B. Embodiments of the key positions 106 and 108 include pins, spring triggers, switches, triggers, or other type of mechanical attributes within the connection socket 104 to identify the type of cable. As depicted in FIG. 1, both the key positions 106 and 108 communicate with the switching circuit 110 to signal which key positions 106 and 108 are being used with the type of cable. Further, utilizing the two key positions 106 and 108 enables the connection socket 104 to support two or more types of cables.

The switching circuit 110 switches between various powered USB cables based on the logic states 112 to deliver the power 114 corresponding to that type of cable. In this embodiment, the switching circuit 110 assigns logic states 112 corresponding to the type of powered USB cable to auto switch the voltage based on the type of powered USB cable which is plugged into the connection socket 104. In another embodiment, the switching circuit 110 may turn off the power 114 (i.e., deliver 0 volts) if it is determined both key positions 106 and 108 are plugged into the connection socket 104. This is a safety feature to prevent voltage on an incorrect connection. In a further embodiment, the switching circuit may include multiple semiconductors and/or switches to assign logic states 112 to delivery of the power 114.

The logic states 112 are representations of a finite number of states that signal to the switching circuit 110 which level of power 114 to provide based on the type of cable detected through the key positions 106 and 108. In one embodiment, the logic states 112 are assigned bits of data to signal to which level power 114 to deliver. This embodiment is described in further detail in FIG. 3B. The logic states 112 may include binary states, Boolean logic, high, low, high-impedance, low impedance, voltage difference between the signal and a reference point, or other type of state to signal which level of power 114 to deliver to one or more peripheral devices.

The power 114 provides electrical energy from the host device 102 to one or more peripheral devices based on the logic states 112. Additionally, the power 114 is considered associated with the type of cable as determined by the key positions 106 and 108. For example, the type of powered USB cable may include 12 volts, thus the key positions 106 and 108 will be in a different pattern compared to a 24 volt powered USB cable, etc. Embodiments of the power 114 include watts, current, electrical change, watts, alternating current, direct current, voltage, analog voltage, digital voltage, or other type electrical energy capable of being supplied from the host device 102.

Figure 2:
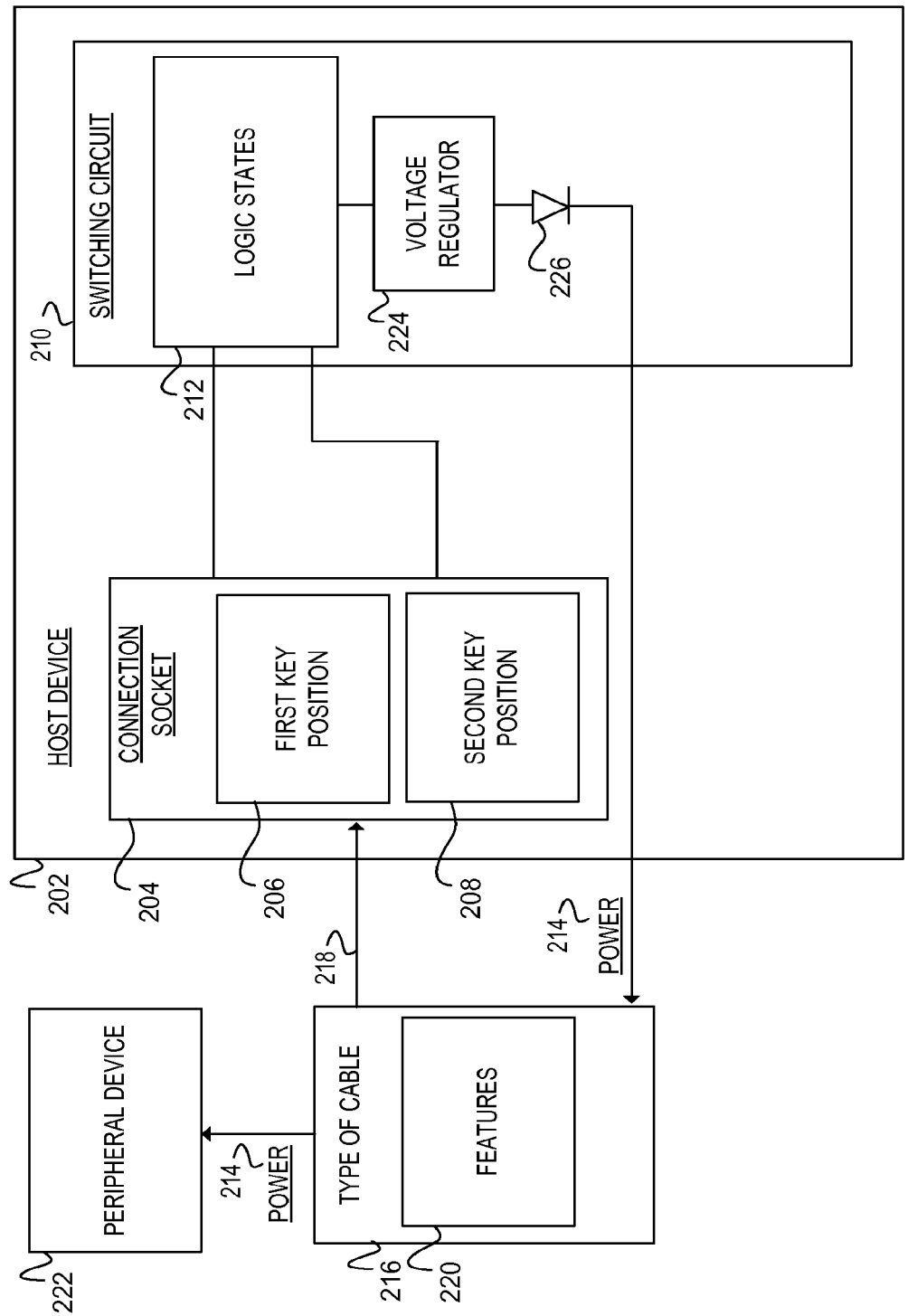
FIG. 2 is a block diagram of an example host device including a switching circuit to assign logic states to a first and second key position in a connection socket to determine a type of cable with features corresponding to the key positions to deliver power to a peripheral device.

FIG. 2 is a block diagram of an example host device 202 including a switching circuit 210 to assign logic states 212 to a first and second key position 206 and 208 in a connection socket 204 to determine a type of cable 216 with features 220 corresponding to the key positions 206 and 208 to deliver power 214 to a peripheral device 222. The host device 202, the connection socket 204, the first key position 206, and the second key position 208 may be similar in structure and functionality to the host device 102, the connection socket 104, the first key position 106, and the second key position 108 as in FIG. 1.

The switching circuit 210 includes the logic states 212, a voltage regulator 224 and a diode 226 to deliver the power 214 through the cable 216 to the peripheral device 222. The voltage regulator 224 is an electrical component which converts and/or maintains the power 214 based on the logic states 212 to the voltage level corresponding to the cable 216. The diode 226 receives the voltage from the voltage regulator 224 to direct a flow of current corresponding to this voltage through the cable 216 to the peripheral device 222. The switching circuit 210 and the logic states 212 may be similar in structure and functionality to the switching circuit 110 and the logic states 112 as in FIG. 1.

The type of cable 216 is inserted into the connection socket 214 and includes the features 220 which correspond to the first and the second key positions 206 and 208 to determine the type of cable 216. As indicated with the line 218 from the type of cable 216 to the connection socket 204, the type of cable includes a plug and/or connector on one end of the cable 216 to insert into the connection socket 204. The connector and/or plug include features 220 of which correspond to the key positions 206 and 208. For example, the features 220 may include one or more pins corresponding to the key positions 206 and 208 such that the pins make a connection between the type of cable 216 and the host device 202. In another embodiment, the type of cable 216 includes a powered USB cable. In this embodiment, the type of cable 216 includes the capability to deliver power in addition to the USB standard data communication, which allows for the peripheral device 222 to obtain power 214 through the host device 202 rather than requiring an independent power supply. Further, in this embodiment, the connection socket 204, includes two connections stacked such that one of the connectors accepts the USB plug and the other connector accepts a power plug. Additionally, this embodiment enables various voltages on the cable 216. For example, the various voltages may include 5 volts, 12 volts, and/or 24 volts and as such, the plug and/or connector may be keyed with three different pattern variations, so the host device 202 will only accept connections requiring that version's voltage. Embodiments of the type of cable 216 include a powered USB cable, USB cable, or other type of cable 216 capable of deliver communications between the peripheral device 222 and the host device 202 and receive power 214 form the host device 202. The power 214 associated with the type of cable 216 may be delivered to the peripheral device 222 through the cable 216. The power 214 may be similar in functionality to the power 114 of FIG. 1.

The features 220 are part of the type of cable 216 and correspond to the positions 206 and 208 for detection. The features 220 are mechanical aspects within the plug and/or connector on one end of the type of cable 216 to identify the cable 216. In one embodiment, the features 220 may insert into the key positions 206 and 208 to determine the type of cable 216, while in another embodiment, the features 220 make a connection with one of the key positions 206 or 208 to identify the cable 216.

The peripheral device 222 receives power 214 through the type of cable 216. In this embodiment, the type of cable 216 may be included as part of the peripheral device 222. For example, the type of cable 216 may be used for connections between the peripheral device 222 and the host device 202 for communications and/or power 214. In another embodiment, the peripheral device 222 includes a retail point of sale device to receive power 214. For example, the peripheral device 222 may include a bar code scanner for use in retail environments. Embodiments of the peripheral device 222 include an electronic device, computing device accessory, mouse, keyboard, scanner, printer, receipt printer, barcode readers, scales, cash drawer, or other type of electronic device 222 capable of receiving power 214 and/or communications from the host device 202 through the type of cable 216.

FIG. 3A is an example connection socket with various locations of the key positions 304, 306, 308, and 310, each location of the key position 304-310 corresponds to a different type of cable.

Figure 3:
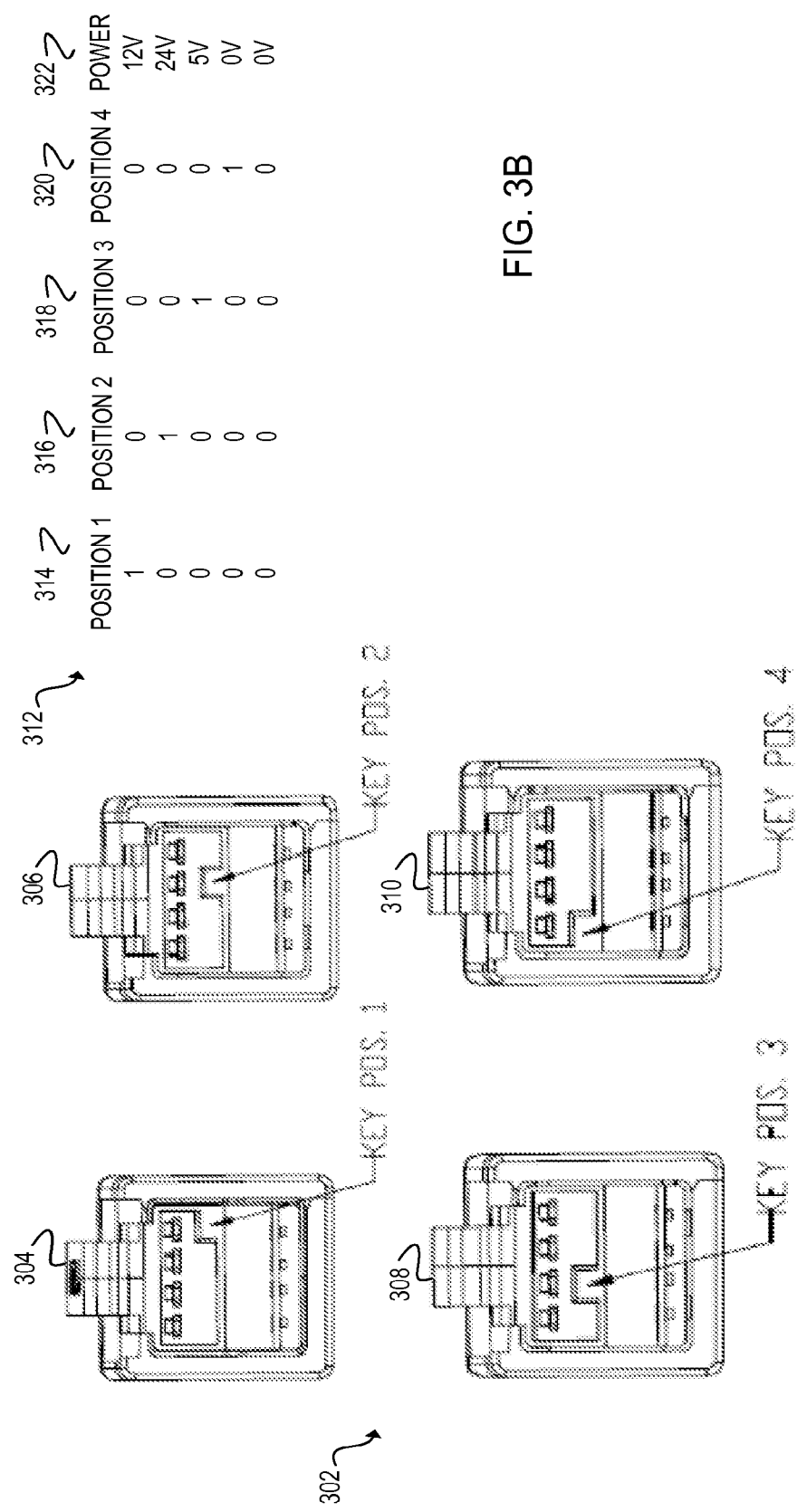
FIG. 3A is a block diagram of an example connector with various location of key positions, each location of the key position corresponds to a type of cable.
FIG. 3B is a data arrangement of an example table of each of the key positions with the corresponding logic states and power.

The various locations of the key positions 304-310 are each considered a different pattern representing a different type of cable. In this embodiment, each of the key position locations 304-310 represents each of the key positions, respectively. For example, key position location 304 represents the first key position, the key position location 306 represents the second key position, the key position location 308 represents the third key position, and the key position location 310 represents the fourth key position. Each of these key position locations 304-310 represent the different type of cable. The different types of cable may correspond to various power levels delivered to a peripheral device. For example, key position location 304 may represent 12 volts, key position location 306 represents 24 volts, key position location 308 represents 5 volts, and key position location represents 0 volts. Thus, in this example, when a corresponding feature on that different type of cable, such as a pin is inserted into key position 304, this cable is identified as the 12 volt cable. Further, although FIG. 3 depicts each of the various key locations 304-310 being located in the top of each connection, embodiments should not be limited to this illustration as the various key position locations 304-310 may be towards the bottom, side, and/or any combination of adjacent locations. Additionally, each of the key positions 304-310 are associated with logic states 314-322 to deliver the corresponding power 322 from the host device to the peripheral device.

FIG. 3B is a data arrangement of an example table 312 of each of the key position locations 304-310 as in FIG. 3A with the corresponding logic states 314-320 and power 322.

The logic states 314-320 are representations of the finite number of states that signal which level of power 322 to deliver from the host device to the peripheral device. For example, the first key position 304 corresponds to "Position 1," accordingly, the "1" is a logic state 314 which indicates the first key position is activated, while the other key position locations 306-310 are inactive as indicated with a "0" logic state. Thus, the corresponding power level 322 to deliver associated with that type of cable based on the logic state of "1" is 12 volts. In another example, the third key position location 308 corresponds to "Position 3," activating a "1" logic state while the first, second, and fourth key position locations 304, 306, and 310 are inactive and thus delivers 5 volts. Additionally, although FIG. 3B illustrates the logic states 314-320 as binary bits, embodiments should be limited to this illustration as it may include impedance or other type of data to indicate the level of power 322 to deliver corresponding to the type of cable.

The power 322 represents various voltage levels corresponding to the types of cables as identified from the key position locations 304-310. Although FIG. 3B, power 322 representing each of the different types of cables with the corresponding voltage level, embodiments should not be limited to this illustration as the power 322 may include various current levels, watts, or other type of electrical energy.

Figure 4:
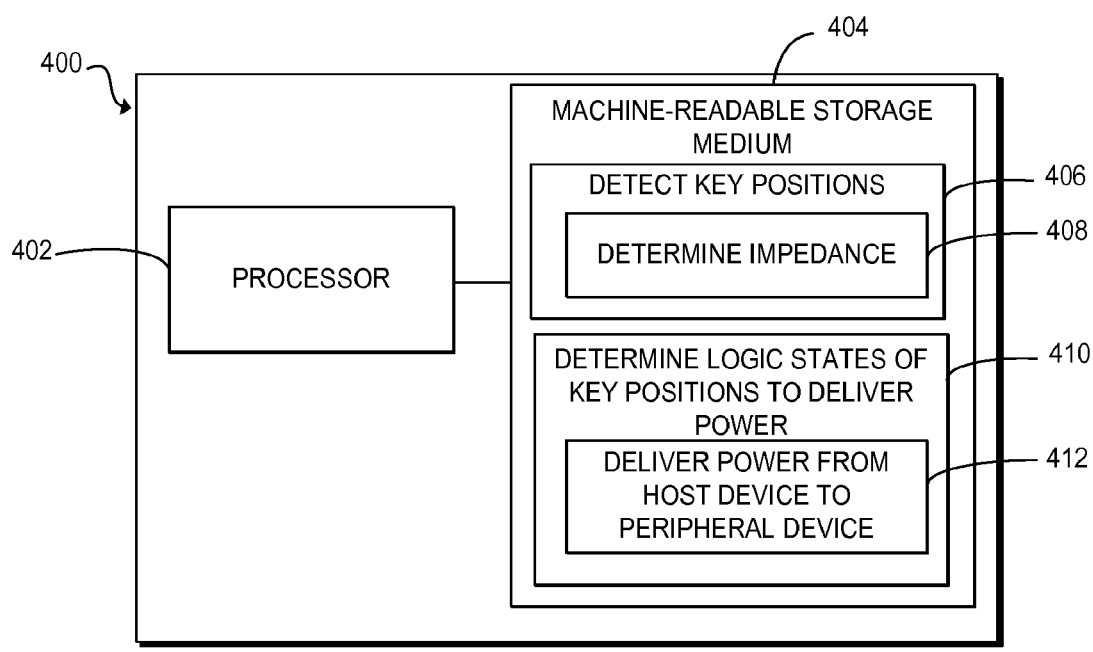
FIG. 4 is a block diagram of an example computing device to detect key positions, determine impedance of each of the key positions, determine logic states of the key positions, and deliver power corresponding to the logic states from a host device to a peripheral device.

FIG. 4 is a block diagram of example computing device 400 including a processor 402 to detect key positions, determine a logic state of each key position to then deliver the power associated with a type of USB cable from the host device to a peripheral device. Although the computing device 400 includes processor 402 and machine-readable storage medium 404, it may also include other components that would be suitable to one skilled in the art. For example, the computing device 400 may include the connection socket 104 and 204 as in FIGS. 1-2, respectively. Additionally, the computing device 400 may be similar in structure and functionality of the host devices 102, 202, as in FIGS. 1-2, respectively.

The processor 402 may fetch, decode, and execute instructions 406, 408, 410, and 412. Specifically, the processor 402 executes: instructions 406 to detect key positions to identify a type of cable; instructions 408 to determine an impedance of each of the key positions; instructions 410 to determine the logic states of the key positions to deliver power; and instructions 412 to deliver power associated with the type of cable from the host device to the peripheral device. Embodiments of the processor 402 include a controller, microchip, chipset, electronic circuit, microprocessor, semiconductor, microcontroller, central processing unit (CPU), graphics processing unit (GPU), visual processing unit (VPU), or other programmable device capable of executing instructions 406-412.

The machine-readable storage medium 404 may include instructions 406, 408, 410, and 412 for the processor 402 to fetch, decode, and execute. The machine-readable storage medium 404 may be an electronic, magnetic, optical, memory, storage, flash-drive, or other physical device that contains or stores executable instructions. Thus, the machine-readable storage medium 404 may include, for example, Random Access Memory (RAM), an Electrically Erasable Programmable Read-Only Memory (EEPROM), a storage drive, a memory cache, network storage, a Compact Disc Read Only Memory (CDROM) and the like. As such, the machine-readable storage medium 404 may include an application and/or firmware which can be utilized independently and/or in conjunction with the processor 402 to fetch, decode, and/or execute instructions of the machine-readable storage medium 404. The application and/or firmware may be stored on the machine-readable storage medium 404 and/or stored on another location of the computing device 400.

Instructions 406 detect the key positions of a USB cable. In another embodiment, instructions 406 detect the key positions of the USB cable by obtaining an impedance measurement of each of the key positions.

Instructions 408 determine an impedance of each of the key positions detected at instructions 406. Impedance is a measure of opposition between each of the key positions in a connection socket of a host device and the USB cable. In this regard, when the key position is plugged in, the impedance measurement of that key position will be minimal, indicating a connection between the USB cable and the host device. This connection indicates the type of USB cable plugged into the connection socket.

Instructions 410 determine logic states of each of the key positions to deliver power. In one embodiment, the logic states are determined by multiple semiconductors, such as transistors. In another embodiment, the logic states are determined through multiple switches for the host device to deliver power at instructions 412. Determining logic states enables the host device to switch between the various levels of power corresponding to the types of the powered USB cables. The logic states further correspond to the type of USB cable to deliver the corresponding power. For example, logic states may include switches to connect and deliver 12 volts or 24 volts of power.

Instructions 412 deliver power to the peripheral device. In another embodiment, instructions 412 deliver voltage corresponding to the type of the USB cable as detected from the key positions at instructions 406.

Figure 5:
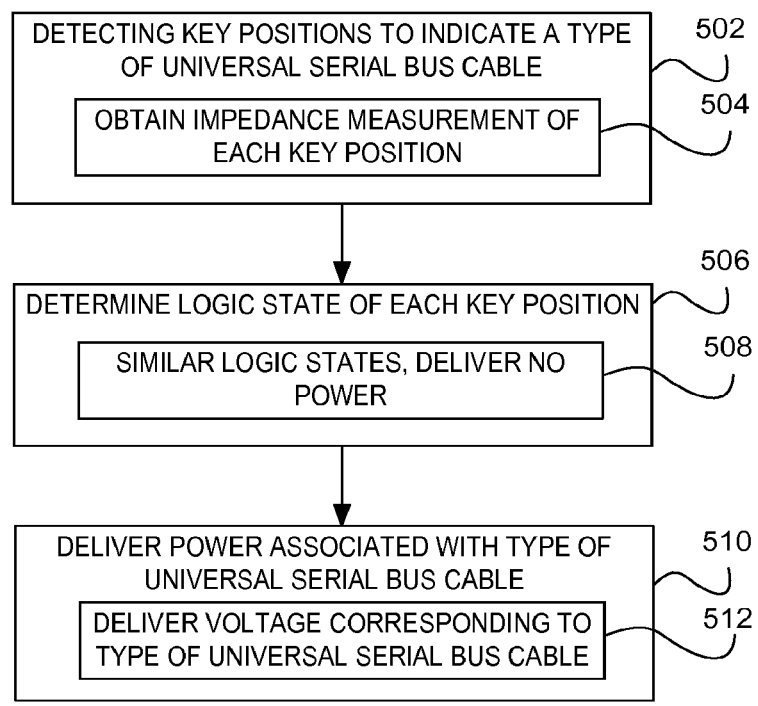
FIG. 5 is a flowchart of an example method performed on a computing device to detect key positions to indicate a type of universal serial bus cable, obtain impedances of each key position, determine a logic state of each key position, and deliver power associated with the type of universal serial bus cable.

FIG. 5 is a flowchart of an example method performed on a computing device to detect key positions indicate a type of universal serial bus cable, obtain an impedance measurement of each key position, determine a logic state of each key position, if the logic states are similar, the computing devices delivers no power, otherwise the computing device delivers the power associated with the type of USB cable, and delivers voltage corresponding to the type of USB cable. Although FIG. 5 is described as being performed on computing device 102, 202, and 400 as in FIGS. 1-2, and 4, it may also be executed on other suitable components. For example, FIG. 5 may be implemented in the form of executable instructions on a machine-readable storage medium, such as machine-readable storage medium 404 in FIG. 4.

At operation 502, the computing device detects the key positions to indicate a type of USB cable. In one embodiment, the type of USB cable is plugged into the computing device. In another embodiment, the computing device obtains the impedance measurement of each key position detected at 502.

At operation 504, the computing device obtains the impedance measurement of each of the key positions detected at operation 502. In this embodiment of operation 504, each type of powered USB cable is indicated as for the key positions, so the first key position has a corresponding feature in the USB cable. When the USB cable is connected, the measure of opposition between the first key position and the feature will be minimal, thus a socket may continue the connection from the USB cable to the host device.

At operation 506, the computing device determines the logic state for each of key positions as detected at operation 502. Determining the logic state, enables a logic state circuit to auto-switch between the different types of powered USB cables.

At operation 508, if the logic states as determined at operation 506, the computing device delivers no power. For example, the logic states of the key positions may both include logic highs, however, this indicates the key positions detected at operation 502 have a mechanical failure. Preventing power delivery at operation 508 prevents additional damage to the cable and/or computing device once the cable and/or socket connection on the computing device may be suffering a mechanical failure.

At operation 510, the computing device delivers power associated with the type of USB cable to a peripheral device. In another embodiment of operation 510, the computing device converts the power into a voltage to deliver to the peripheral device. In a further embodiment of operation 510, the computing device delivers voltage corresponding to the type of USB cable to the peripheral device, such as at operation 512.

At operation 512, the computing device delivers a voltage corresponding to the type of USB cable as detected from the key positions at operation 502.

In summary, example embodiments disclosed herein provide a universal powered USB connection socket to detect the type of USB cable and to deliver the corresponding voltage. Further, example embodiments save time and space by providing a universal connection for multiple types of USB cables. In addition, examples provide a connection socket to detect the type of cable for cables other than USB cables.

What is claimed is:

1. A non-transitory machine-readable storage medium encoded with instructions executable by a processor, the machine-readable storage medium comprising instructions to:
   obtain an impedance measurement at each key position of a connection socket;
   detect a plugged cable at a key position based on the obtained impedance measurement;
   in response to the detected plugged cable at the key position, determine an assigned power level associated to the key position;
   deliver a power through the plugged cable according to the determined assigned power level based on a logic state that represents assigned bits of data to signal a level of power to be delivered to the key position.

2. A non-transitory machine-readable storage medium as recited in claim 1, wherein the impedance measurement of the key position that includes the plugged cable includes a minimal impedance.

3. A non-transitory machine-readable storage medium as recited in claim 1, wherein each key position includes a type of mechanical attribute to match a type of the plugged cable.

4. A non-transitory machine-readable storage medium as recited in claim 3, wherein each type of plugged cable includes a corresponding amount of associated power level.

5. A non-transitory machine-readable storage medium as recited in claim 1, wherein each key position includes a logic state.

6. A non-transitory machine-readable storage medium as recited in claim 5, wherein each logic state corresponds to a type of plugged cable and to a power level associated with the type of plugged cable.

7. A non-transitory machine-readable storage medium as recited in claim 1, wherein the power is delivered through the plugged cable or a separate power cable of the same plugged cable.

8. A non-transitory machine-readable storage medium as recited in claim 1, wherein the connection socket interfaces the plugged cable with a host device that supplies the power.

9. A host device that includes a connection socket with multiple key positions to fit different types of cables, the host device to perform operations comprising:
   obtain an impedance measurement at each of the multiple key positions of the connection socket;
   detect a connected cable at a key position based upon the obtained impedance measurement at the key position;
   deliver a power through the detected connected cable at the key position, wherein the power delivered is based on a logic state that represents assigned bits of data to signal a level of power to be delivered to the key position.

10. A host device as recited in claim 9, wherein the host device to measure a minimal impedance on the key position that includes the connected cable.

11. A host device as recited in claim 9, wherein each key position includes a type of mechanical attribute to match a type of the connected cable.

12. A host device as recited in claim 11, wherein the host device includes a switching circuit to assign logic states to each key position, wherein each logic state corresponds to a type of connected cable and to a power level associated with the type of plugged cable.

13. A method executed by a computing device comprising:
   obtaining an impedance measurement at each key position of a connection socket;
   detecting, a plugged cable at a key position based upon the obtained impedance measurement at the key position;
   determining, in response to the detected plugged cable at the key position, an assigned voltage level associated to the key position; and
   delivering a power through the key position and the plugged cable based on the determined assigned voltage level based on a logic state that represents assigned bits of data to signal a level of power to be delivered to the key position.

14. A method as recited in claim 13, wherein the impedance measurement of the key position that includes the plugged cable includes a minimal impedance.

15. A method as recited in claim 13, wherein each key position includes a type of mechanical attribute to match a type of the plugged cable.

* * * * *